US010820415B1

(12) United States Patent
Stenfort (10) Patent No.: US 10,820,415 B1
(45) Date of Patent: Oct. 27, 2020

(54) ADAPTER FOR REMOVABLE COMPUTER EXPANSION DEVICES

(71) Applicant: Facebook, Inc., Menlo Park, CA (US)

(72) Inventor: Ross Stenfort, Los Altos, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 16/443,612

(22) Filed: Jun. 17, 2019

(51) Int. Cl.
*H05K 1/14* (2006.01)
*G06F 13/38* (2006.01)
*H05K 1/02* (2006.01)

(52) U.S. Cl.
CPC .......... *H05K 1/141* (2013.01); *G06F 13/385* (2013.01); *H05K 1/0201* (2013.01); *H05K 2201/04* (2013.01); *H05K 2201/06* (2013.01)

(58) Field of Classification Search
CPC .......... G06F 1/185; G06F 1/186; G06F 13/38; G06F 13/385; G06F 13/387; H05K 1/141
See application file for complete search history.

(56) References Cited

U.S. PATENT DOCUMENTS

| | | | | |
|---|---|---|---|---|
| 5,887,145 A * | 3/1999 | Harari | ................. | G06F 13/4068 710/13 |
| 6,075,706 A * | 6/2000 | Learmonth | .......... | G06K 19/077 361/737 |
| 7,351,110 B1 * | 4/2008 | Wu | ......................... | G06F 3/023 439/638 |
| 7,493,437 B1 * | 2/2009 | Jones | ...................... | G06F 13/38 710/301 |
| 7,660,346 B1 * | 2/2010 | Klissner | ................. | G06F 13/385 375/219 |
| 9,098,254 B2 * | 8/2015 | Utz | .......................... | G06F 1/187 |
| 10,359,815 B1 * | 7/2019 | Lin | .......................... | G06F 1/183 |
| 2003/0112595 A1 * | 6/2003 | Kwong | ................. | G11B 33/122 361/679.33 |
| 2004/0023522 A1 * | 2/2004 | Chang | .................... | H01R 29/00 439/43 |
| 2006/0221581 A1 * | 10/2006 | DeNies | ................. | H05K 7/1461 361/740 |
| 2006/0230440 A1 * | 10/2006 | Wu | .......................... | G06F 21/80 726/9 |
| 2006/0253636 A1 * | 11/2006 | Jones | ...................... | G06F 13/38 710/301 |
| 2008/0037211 A1 * | 2/2008 | Martin | ................. | G11B 25/043 361/679.37 |
| 2008/0218959 A1 * | 9/2008 | Wu | .......................... | G06F 1/187 361/679.31 |

(Continued)

*Primary Examiner* — Adrian S Wilson
(74) *Attorney, Agent, or Firm* — Van Pelt, Yi & James LLP (57) ABSTRACT

In an embodiment, an adapter assembly includes a plurality of system connectors configured to simultaneously engage a plurality of receiving connectors of an external system when inserted in the external system and simultaneously disengage from the plurality of receiving connectors of the external system when disengaged from the external system. The adapter assembly includes a device-receiving connector configured to engage a connector of a removable device, where the adapter assembly is configured to house at least a portion of the removable device. The adapter assembly includes connections between at least a portion of the plurality of system connectors and the device-receiving connector, where the connections are configured to route communication lanes of the removable device to one or more of the plurality of system connectors.

20 Claims, 6 Drawing Sheets

(56) References Cited

U.S. PATENT DOCUMENTS

| | | | |
|---|---|---|---|
| 2009/0167124 A1* | 7/2009 | Lee | G06F 1/187 |
| | | | 312/223.2 |
| 2010/0315774 A1* | 12/2010 | Walker | G06F 1/185 |
| | | | 361/679.58 |
| 2011/0294309 A1* | 12/2011 | Chen | H04L 49/45 |
| | | | 439/65 |
| 2015/0277935 A1* | 10/2015 | Desimone | G06F 9/4411 |
| | | | 710/313 |
| 2016/0073544 A1* | 3/2016 | Heyd | G11B 33/128 |
| | | | 361/679.31 |
| 2019/0114220 A1* | 4/2019 | Stenfort | G06F 11/1004 |

* cited by examiner

ADAPTER FOR REMOVABLE COMPUTER EXPANSION DEVICES

BACKGROUND OF THE INVENTION

There are many ways that a device can plug into another computer device. One standardized form factor for interconnecting devices is M.2 (Next Generation Form Factor). Another example of a standardized form factor is EDSFF (Enterprise and Data Center Solid State Device Form Factor). These protocols define how to design or structure connectors for a computer expansion card such as an SSD (solid state drive) to be installed inside the computer. Conventionally, a particular type of receiving connector on a server system requires a specific compatible expansion card connector. For example, a drive bay that supports one form factor (M.2 for example) cannot accept devices using other form factors (EDSFF for example). This makes expansion cards utilizing new form factors incompatible with legacy server systems that do not include a corresponding receiving connector. It is often inefficient and costly to replace these legacy server systems to be able to support new expansion card form factors.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Embodiments of an adapter for computer server devices are disclosed. The adapter assembly is a carrier or cartridge that accepts one or more removable devices (such as a storage drive, coprocessor device, computation unit, processing accelerator device, application-specific integrated circuit (ASIC) device, field-programmable gate array (FPGA) device or any other device expanding computer capabilities of a system) of one form factor (EDSFF for example) and connects the removable device(s) to a drive bay (port) of an external system that uses a different form factor (M.2 for example). The adapter assembly has a number of advantages. In one aspect, the adapter assembly supports a variety of connector form factors. This means that an existing type of drive bay can be used and the adapter assembly will convert between form factors to enable a variety of devices to communicate with the external system. This allows different types of devices to be mixed and matched. In another aspect, devices are hot pluggable into the drive bays meaning that users are able to insert and remove devices from a running computer without having to shut down or reboot the system or causing any system crash. The adapter assembly allows a device that is not natively configured to be hot-pluggable to be hot-pluggable so that it may be plugged and unplugged from a system without having to interrupt system operation.

In various embodiments, a removable device (e.g., expansion card) such as a storage or accelerator drive conforms to a connector form factor (e.g., an EDSFF interface connector) not directly supported by an external receiving system (e.g., server). The external receiving system accepts the carrier or cartridge having a system connector conforming to a different form factor specification (e.g., the M.2 specification). The carrier or cartridge also has a device-receiving connector that supports connector form factor of the removable device (e.g., with an EDSFF interface connector). The adapter assembly houses at least a portion of the removable device, and the adapter assembly converts between M.2 and other form factors (such as EDSFF) so that the carrier or cartridge can receive one or more devices that use a connector and/or signaling form factor different from one directly supported by the external receiving system.

Using electrical connections between the system connector and the device receiving connectors, the carrier or cartridge electrically routes and/or translates signals from a removable device engaged with the carrier or cartridge. The carrier or cartridge includes a mechanism that facilitates and ensures a proper and secure connection of each removable device to the carrier and includes thermal elements to help dissipate heat from the removable devices engaged with the carrier or cartridge.

In some embodiments, the external receiving system includes a plurality of separate receiving connectors configured to be simultaneously utilized with a same expansion card, carrier, or cartridge. For example, two connectors (e.g., two M.2 connectors) are utilized to overcome bandwidth and/or limitation on a number of channels associated with just using a single connector.

In some embodiments, the adapter is configured to accept a plurality of removable devices at the same time. By allowing multiple removable devices to be interfaced via a single adapter assembly, a drive bay of the receiving system intended for a single removable device is able to support a plurality of removable devices via the adapter.

More specifically, an adapter assembly is disclosed comprising system connectors, a device-receiving connector, and connections between (at least some of) the system connectors and the device-receiving connector. The system connectors are configured to simultaneously engage a plurality of receiving connectors of an external system when inserted in the external system and simultaneously disengage from the plurality of ports of the external system when pulled from the external system. For example, the external system is a processor subsystem of a server and the ports of the external system and the system connectors of the adapter system accommodate an M.2 form factor.

The device-receiving connector is configured to engage a connector of a removable device that can be housed at least in part within the adapter assembly. For example, the removable device is a device that conforms to the EDSFF form factor. Examples of the removable device include one or more of the following: a storage drive, coprocessor device, computation unit, processing accelerator device, application-specific integrated circuit (ASIC) device, field-programmable gate array (FPGA) device or any other device expanding computer capabilities of a system.

Figure 1:
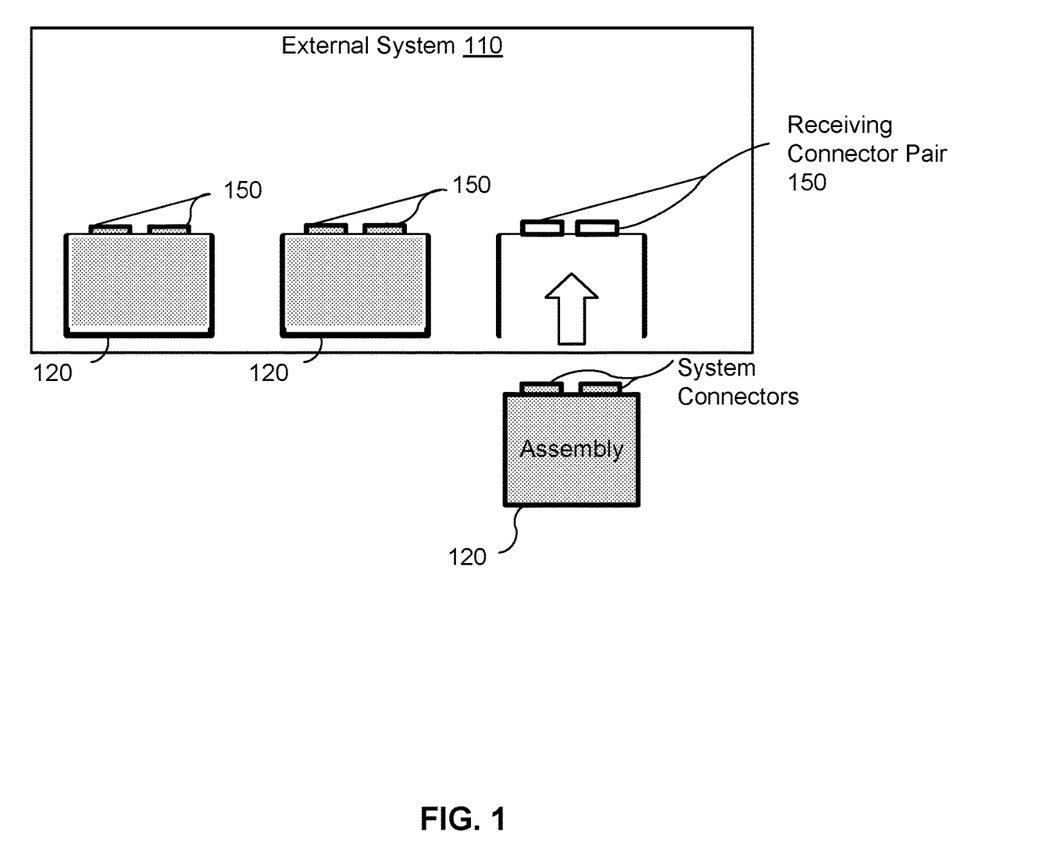
FIG. 1 is a diagram illustrating an embodiment of an external system configured to receive an adapter assembly.

The connections between (at least a portion of) the system connectors and the device-receiving connector are configured to route communication lanes of the removable device to one or more of the plurality of system connectors. The next figure shows an example of an external system with a number of drive bays configured to receive the adapter assembly.

FIG. 1 is a diagram illustrating an embodiment of an external system configured to receive an adapter assembly. The external system 110 can be a machine comprising a server, storage device, networking device, network switch, and/or processing device. System 110 may include various components including a processor, a data communication bus, firmware, and the like. System 110 includes one or more recessed regions, bays, slots, and/or internal regions configured to receive assembly 120. Each of these has receiving connector pair 150. As shown, each receiving connector pair is a pair of connectors configured to receive system connectors from a removable device or assembly. Each pair of connectors is configured to be engaged and disengaged simultaneously. For example, when a removable device or assembly is to be inserted or put in the recessed region, bay, slot, and/or internal region, system connectors of the removable device or assembly engage with the corresponding receiving connectors simultaneously and when the removable device or assembly is removed, the system connectors disengage from the receiving connectors simultaneously. Although a pair is shown in FIG. 1, in other embodiments, any number of receiving connectors may be assigned to each recessed region, bay, slot, and/or internal region.

In the example of FIG. 1, assembly 120 can be inserted or plugged into the receiving connector pair 150 and can be removably attached at an interface within each of the receiving connector pair 150 configured to receive each assembly. The receiving connector pair 150 is configured to connect not only to assembly 120 but also other devices that are not adapter assemblies. For example, a storage device that includes system connectors (e.g., pair of M.2 connectors) compatible with receiving connectors 150 are able to be put it the recessed region, bay, slot, and/or internal region of the corresponding system connector pair 150.

Thus each instance of the receiving connectors 150 is able to interchangeably accept a standard drive or removable device or an adapter assembly (e.g., carrier/cartridge housing one or more removable devices utilizing a different connector (e.g., EDSFF) than the system connector of adapter assembly.

A communication bus (not shown) on the external system allows various components on external system 110 and a device connected via receiving connector pair 150 to communicate with each other. In some embodiments, the bus is a PCI Express (Peripheral Component Interconnect Express), abbreviated as PCIe or PCI-e bus standard. PCIe is a high-speed serial computer expansion bus standard designed to provide improvements over and replace older standards such as PCI, PCI-X, and AGP bus standards. Compared to older standards, PCIe provides higher maximum system bus throughput, lower I/O pin count and smaller physical footprint, better performance scaling for bus devices, and a more detailed error detection and reporting mechanism.

In some embodiments, communication between external system 110 and a device connected via receiving connector pair 150 does not require a translation because the device connected via receiving connector pair 150 is able to directly communicate via the bus of external system 110. For example, the device connected via receiving connector pair 150 is a PCIe compatible device that can communicate with external system 110 via the PCIe bus of external system 110.

In some embodiments, external system 110 includes firmware configured to perform a translation between the operating system of the external receiving system and the carrier or cartridge and to detect insertion and removal of a carrier or storage cartridge. In particular, the firmware is configured to detect that a device 120 has been inserted into the system 110 and to determine whether the device is a single device or whether it is a carrier that includes multiple devices including not natively hot-pluggable devices. Once the firmware detects the type of device that has been powered on and/or plugged into one of the receiving connectors 150, the firmware provides the operating system of external system 110 with access to the detected removable drive or multiple drives of the cartridge. This may involve identifying the insertion and removal of the appropriate removable drives to the operating system as well as handing any required data selection, translation or operation to enable system 110 to access the multiple drives of the cartridge.

Additionally, the firmware is configured to detect when a device 120 including a carrier or storage cartridge is unplugged, removed, powered off, or pulled out of the system. In the example shown, the firmware detects that a connected carrier is not a connection to a single device, but is instead a connection to multiple devices, and also communicates to the operating system that two drives have been pulled out upon detecting that the carrier has been removed.

This feature where the firmware communicates with the operating system ensures that the technique is connector independent.

The firmware can be low level firmware running on the system platform itself or it can be embedded various hardware components. For example, the firmware is embedded in a PCIe switch that takes the PCIe bus and fans it out to more than one bus. The firmware is configured to detect when devices are removed or inserted and to handle that mechanism within the PCIe framework correctly so that removal of the device does not flag an error or propagate an error up the stack and cause other problems in the system.

Figure 2A:
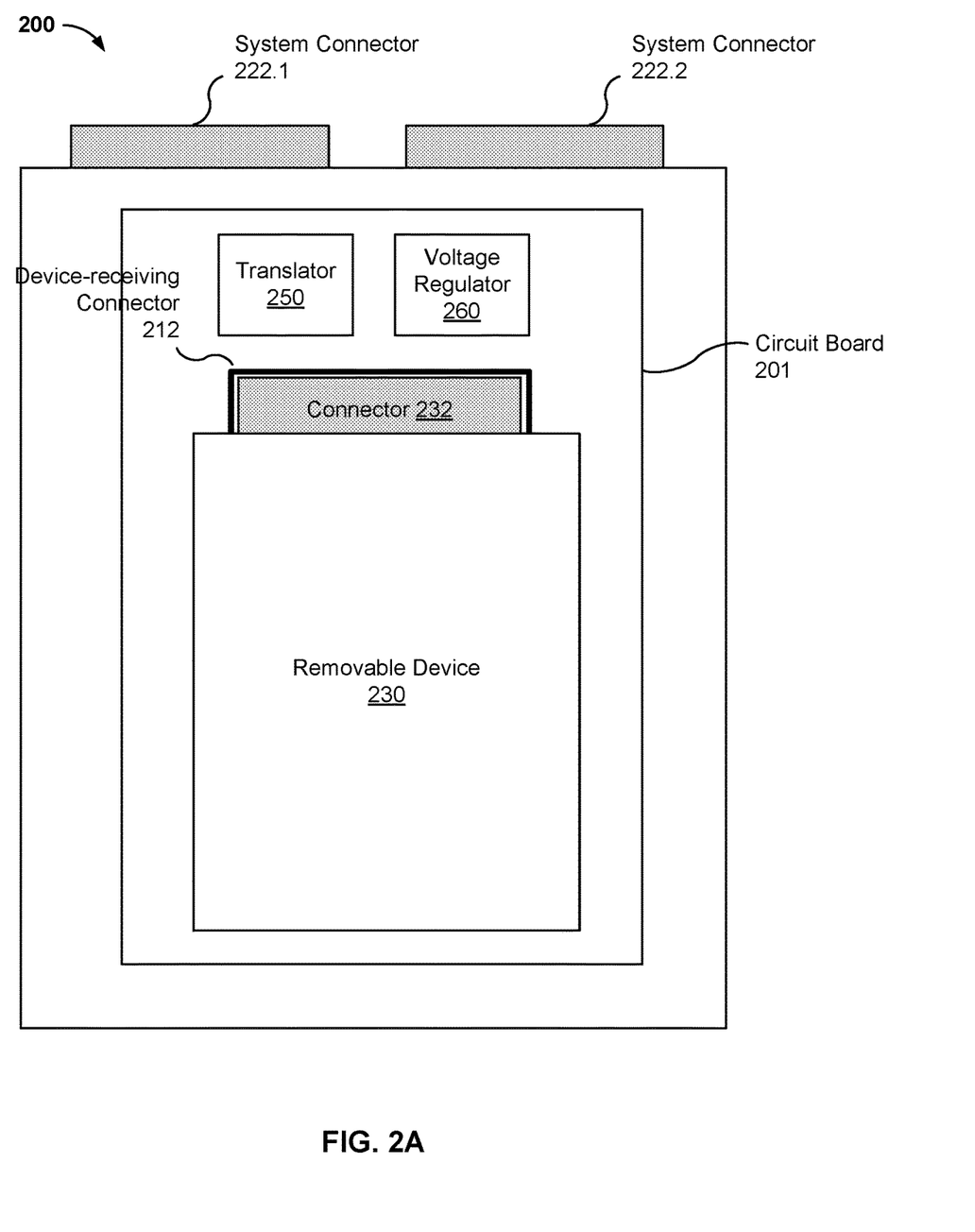
FIG. 2A is a diagram illustrating an embodiment of an adapter assembly.

FIG. 2A is a diagram illustrating an embodiment of an adapter assembly. The adapter assembly is an example of assembly 120 that can be plugged into external system 110 shown in FIG. 1. The adapter assembly 200 is sometimes referred to here as a carrier or storage cartridge. The adapter assembly includes system connectors 222.1 and 222.2 (collectively referred to as system connectors 222) and one or more device-receiving connectors 212. In various embodiments, each of system connectors 222 conforms to the M.2 interface specification. In some embodiments, each of system connectors 222 is an edge connector with 75 positions and 67 pins. The system connectors are pluggable into receiving connectors of an external receiving system such as connector pair 150 of external system 110 of FIG. 1. Device receiving connector 212 (e.g., EDSFF receiving connector) is configured to receive connector 232 (e.g., EDSFF connector) of removable devices 230. In various embodiments, device receiving connector 212 has either 56, 84, 140, or 168 pin positions. Examples of removable device 230 include a storage drive, coprocessor device, computation unit, processing accelerator device, application-specific integrated circuit (ASIC) device, field-programmable gate array (FPGA) device or any other device expanding computer capabilities of a computer/server system. An advantage of the adapter assembly disclosed herein is that it allows an existing prior generation interface (e.g. M.2 interface) and a flexible bus standard for communicating between components (e.g., a PCIe bus) to support a new interface not natively supported by an existing external system.

In some embodiments, adapter assembly 200 includes a plurality of instances of device receiving connector 212 that each connect to a different removable device. This allows adapter assembly 200 to at least part house a plurality of removable devices and provide access to the plurality of removable devices via the single adapter assembly. Data to/from plurality of removable devices are accessed via system connectors 222 by the external system.

Adapter assembly 200 can be one of the multiple assembles 120, as shown in FIG. 1, configured to connect to system 100, for example, by insertion into one of the recessed regions or slots with one of the receiving connector pair 150. In various embodiments, in addition to the system connectors 222, the carrier or storage cartridge 200 includes circuit board 201 (e.g., printed circuit board) on which the device receiving connector 212 and/or system connectors 222 are mounted or soldered. Circuit board 201 also includes other components including Translator 250 and Voltage Regulator 260.

System connector 222 is configured to couple or engage with an external system (e.g., system external to assembly 200. In some embodiments, the system connector includes connector pins that are organized and designed to be physically staggered (e.g. configured with different pin lengths) to provide an interface configured to support hot plugging to the external system. For example, the interface is configured to handle spikes and rush current resulting from installing a device and it powering up. In some embodiments, the connector pins are configured to support multiple insertion and removal cycles.

In some embodiments thicker layers of gold plating are used and guidance features are mechanically molded into the device receiving connectors to ensure proper alignment when inserted a receiving connector. Connector pin layouts and the sizes of the connector pins themselves are configured to connect at particular times to allow the user to electrically control how power comes up and how the devices are protected. In some examples, additional guide slots, pins, notches, or holes are used to aid in proper insertion of a component between other live components.

In some embodiments, a mechanism is provided that supports hot plugging and is able to identify whether a device inserted into the external system 100 of FIG. 1 is a standard device (e.g. a standard hard drive or hot-pluggable single storage device natively using form factor/interface of the external system) or whether the device is the disclosed adapter assembly 200 having removable device 230 connected via a connector not natively supported by the external system (e.g., EDSFF connector).

Given that the adapter assembly 200 can facilitate the connection of one or more removable devices 230 to an external system via system connector 222, the mechanism also allows identification and detection of device 230 coupled to adapter assembly 200 by the external system. Although only one removable device 230 is shown, this is merely exemplary and not intended to be limiting. In other embodiments, the assembly may include several removable devices/drives.

Circuit board 201 includes one or more electrical traces and/or wires that allow data communication to pass through one or more connector pins of system connectors 222 to one or more connector pins of removable device connector 232. For example, PCIe bus data lanes of the external system interfaced certain connector pins of system connectors 222 are routed to corresponding connector pins of removable device connector 232 via the electrical traces and/or wires of circuit board 201. In some embodiments, communication between the external system and removable device 230 connectors does not require a protocol translation because device 230 is a type of device (e.g., PCIe device) that is able to directly communicate via the bus of external system.

In some embodiments, the external receiving system comprises a microcontroller (not shown) that runs firmware to detect and discover devices. In some embodiments, the external receiving system is configured to detect an identifying device such as EEPROM to detect and identify device 230. For example, the external receiving system attempts to read data stored in EEPROM (e.g., on circuit board 201) that identifies the type of device (e.g., adapter assembly or standard device) connected to connector pair 150. For example, the firmware of the external receiving system may attempt to read the data stored in an EEPROM, if any, and if it fails to read data or detect the EEPROM, then the firmware may determine that a standard device (i.e., not adapter assembly 200) has been connected. The data stored in the EEPROM of circuit board 201 may identify not only the existence/type/configuration of the cartridge that has been connected, but also type, number, and/or configuration of component removable devices housed by the adapter assembly.

Voltage Regulator 260 provides a voltage translation between a provided voltage (e.g., 3.3V provided via system connectors 222) to another voltage required to power the removable device (e.g., 12V for removable device 230). For example, voltage provided via one or more pins of system connectors 222 is transformed into a different output voltage provided via one or more pins of removable device connector 232 via device connector 212. Thus Voltage Regulator 260 allows power voltage of one form factor to be transformed for used in another form factor.

Translator 250 shifts, boosts, or translates signals to/from an external system connected to adapter 200 from/to removable device 230. For example, voltage amplitude levels of a data signal in one form factor (e.g., M.2 form factor) may be different from voltage amplitude levels of another form factor (e.g., EDSFF form factor), and translator 250 functions as a level shifter to shift/translate signal levels appropriately for communication between the different form factors. In some embodiments, translator 250 functions as a signal repeater to repeat signals to/from an external system connected to adapter 200 from/to removable device 230 to ensure that a power and/or level of the signal is maintained and minimally degraded/reduced as it travels in adapter assembly 200 between system connectors 222 (e.g., connected to external system) and device connector 212 (e.g., connected to removable device 230).

The number of system connectors 222 is merely exemplary and not intended to be limiting. For example, adapter assembly 200 can have more or less system connectors in other embodiments.

Figure 2B:
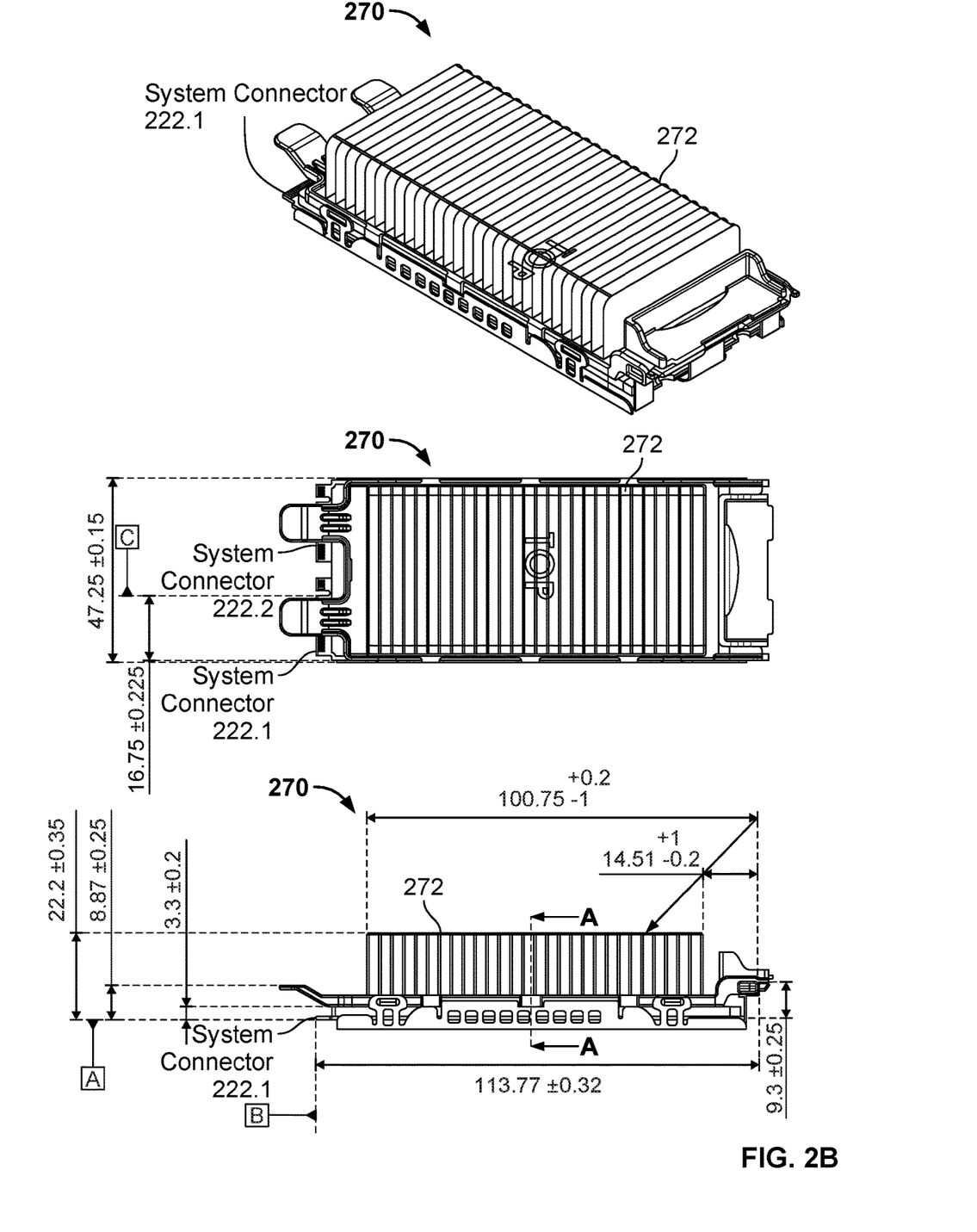
FIG. 2B is a diagram illustrating various views of an embodiment of an adapter assembly.

FIG. 2B is a diagram illustrating various views of an embodiment of an adapter assembly. Adapter assembly 270 is an example of assembly 120 that can be plugged into external system 110 shown in FIG. 1. Adapter assembly 270 is a version of adapter assembly 200 of FIG. 2A with a heat sink cover. Adapter assembly 270 includes all of the components of adapter assembly 200 but also includes thermal element 272 (e.g., heat sink) that covers at least a portion of removable device 230. Thermal element 272 is removable and made of a heat conductive material (e.g., metal). Thermal element 272 is configured to dissipate heat generated by one or more components of circuit board 201 and/or removable device 230. In some embodiments, thermal element 272 includes a plurality of fins.

In various embodiments, the adapter assembly has a mechanical engagement element (e.g., latch) configured to engage with a corresponding mechanical engagement element (e.g., hole, opening, or hook element) coupled to a chassis of the external system. Some example dimensions are shown in FIG. 2B but this is merely exemplary and not intended to be limiting.

Adapter assembly 200 and adapter assembly 270 accommodate 2, 4, 8, or more data communication channels/lanes (e.g., PCIe lanes) from each removable device in various combinations in various different embodiments. Some combinations of communications lane mappings are shown in FIGS. 3A-3D.

FIGS. 3A-3D show examples of connections between system connectors and one or more device-receiving connector of an adapter system. The connections route communication channels/lanes of communication links of the removable device to the external system via the system connector(s). The system connector uses the M.2 interface form factor while the device-receiving connector uses the EDSFF interface form factor to accommodate a removable device such as device 230 of FIG. 2A. Each M.2 system connector accommodates up to four communication channels/lanes (e.g., 4 PCIe lanes) so the adapter assembly with 2 system connectors is an 8-lane device in some embodiments. In some embodiments, each of the shown connections represent a corresponding physical connection (e.g., via a circuit board trace or wire). For example, a shown connection represents a connector pin to connector pin connection via a circuit board trace. In some embodiments, one or more intermediary components exists in the path but are not shown. For example, a level shifter, a signal repeater, and/or signal translator (e.g., translator 250 of FIG. 2A) exists in the path to level shift, repeat, or otherwise translate signals of the path between different form factors. In each of FIGS. 3A-3C, two system connectors are shown corresponding to system connector 222.1 and 222.2 of FIGS. 2A and 2B. Two system connectors allows the adapter assembly to be plugged into an external system.

Figure 3A:
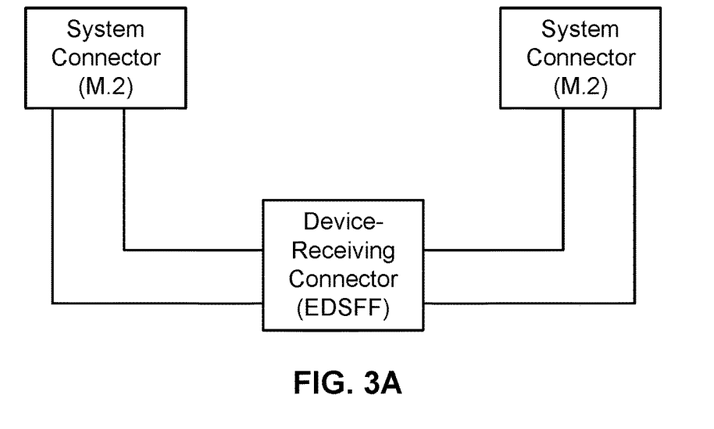
FIG. 3A show examples of connections between system connectors and one or more device-receiving connector of an adapter system.

In the embodiment of FIG. 3A, a removable device connected to the device receiving connector of FIG. 3A (e.g., connector 212 of FIG. 2A) utilizes 4 communication channels/lanes (e.g., 4 PCIe lanes). Two of these lanes are connected to one of the system connectors while the other two of these lanes are connected to the other system connector in FIG. 3A.

Figure 3B:
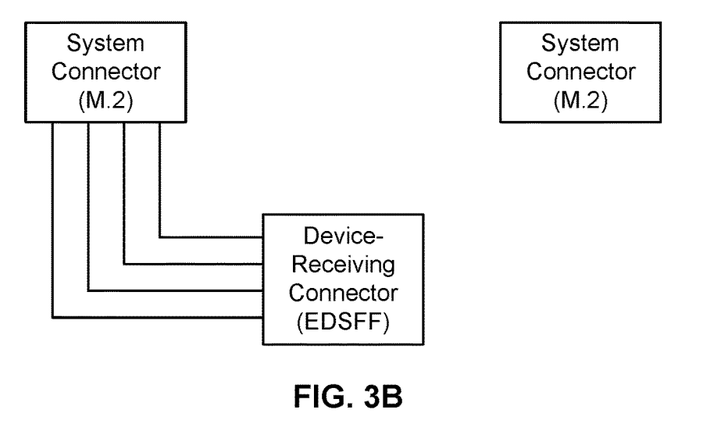
FIG. 3B show examples of connections between system connectors and one or more device-receiving connector of an adapter system.

In the embodiment of FIG. 3B, a removable device connected to the device receiving connector of FIG. 3A (e.g., connector 212 of FIG. 2A) utilizes 4 communication channels/lanes (e.g., 4 PCIe lanes). All four of these lanes are connected to one of the system connectors while the other system is not utilized in FIG. 3B.

Figure 3C:
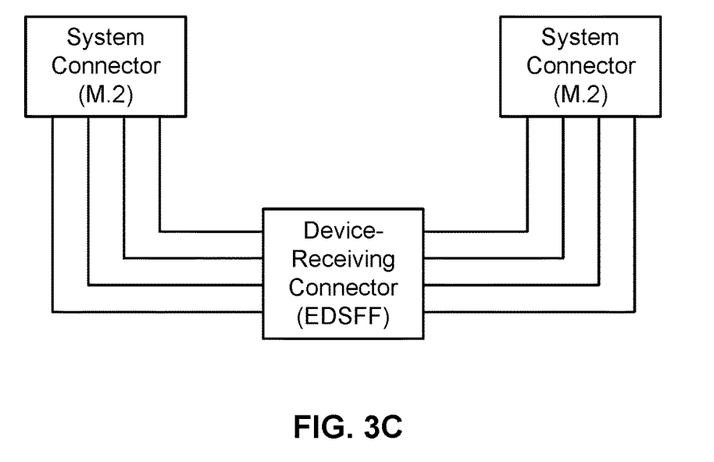
FIG. 3C show examples of connections between system connectors and one or more device-receiving connector of an adapter system.

In the embodiment of FIG. 3C, a removable device connected to the device receiving connector of FIG. 3A (e.g., connector 212 of FIG. 2A) utilizes 8 communication channels/lanes (e.g., 8 PCIe lanes). Four of these lanes are connected to one of the system connectors while the other four of these lanes are connected to the other system connector in FIG. 3C.

Figure 3D:
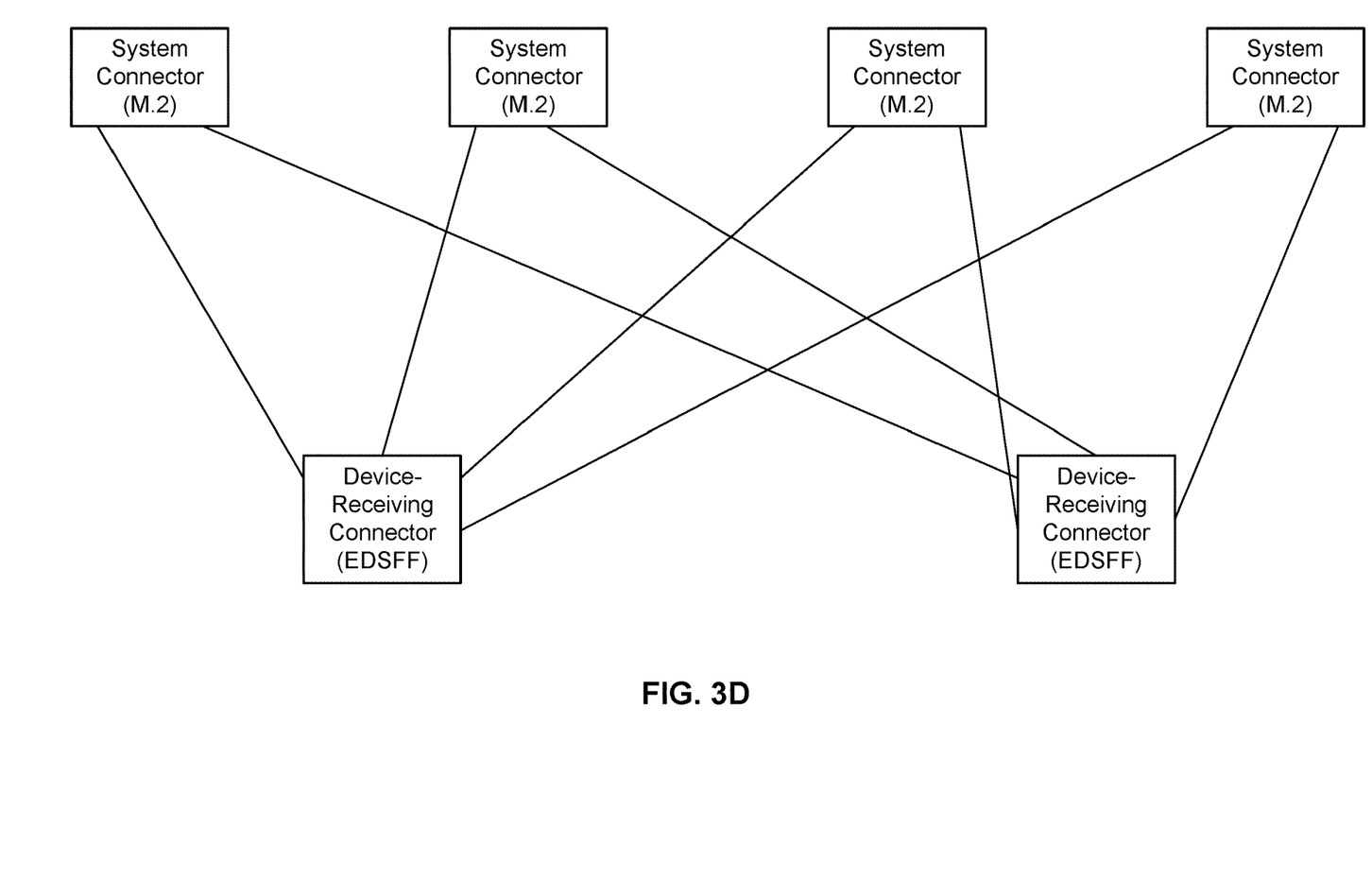
FIG. 3D show examples of connections between system connectors and one or more device-receiving connector of an adapter system.

In the embodiment of FIG. 3D, the shown device-receiving connectors of an adapter assembly accommodates a plurality of removable devices and a different removable device can be plugged into each of the two different device-receiving connectors. A removable device connected to one of the device-receiving connectors utilizes 4 communication channels/lanes (e.g., 4 PCIe lanes) and another removable device connected to the other device-receiving connector also utilizes 4 communication channels/lanes (e.g., 4 PCIe lanes). In the embodiment of FIG. 3D, the four shown system connectors of the adapter assembly connects to four corresponding connectors of an external system. Each of different communication lane of each device-receiving connector is connected to a different one of the system connectors shown in FIG. 3D. In effect this creates a fully connected mesh of connections that may improve bandwidth and improve fault tolerance.

The number of connectors shown are merely exemplary and not intended to be limiting. For example, any number of system connectors may be utilized in various other embodiments to accommodate more or less communication lanes.

Figure 4:
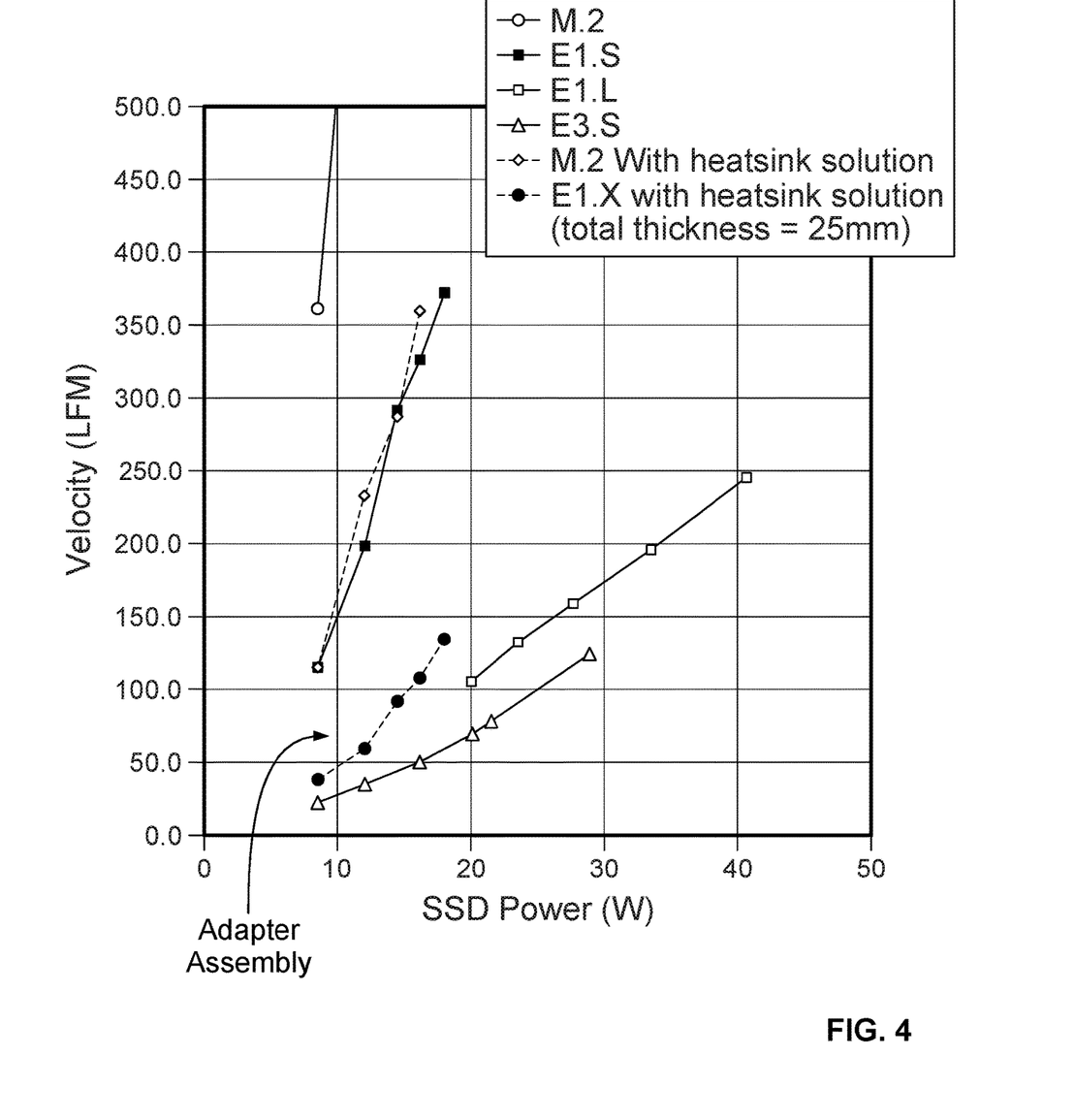
FIG. 4 shows an example chart of required fan speed to manage heat as a function of power consumption.

The disclosed embodiments of an adapter has many benefits. FIG. 4 shows an example chart of required fan speed to manage heat as a function of power consumption. In this example, the adapter assembly is 25 mm thick/wide, which is relatively small and flat compared with conventional carriers or cartridges. The adapter assembly here accepts an EDSFF removable device and has a heatsink. Curves showing the relationship between fan speed and power utilized by the same storage drive for various form factors are plotted in the graph shown in FIG. 4. For example, a conventional M.2 form factor has the highest fan speeds to obtain the desired cooling levels (SSD power). The E1.L and E3.S form factors are too large for many desired storage and computing applications. The curve representing the adapter assembly (e.g., shown in FIGS. 2A and 2B) allow the fans to run more slowly while obtaining the desired level of cooling. In other words, power and thermal scales to over 20 W average power for storage applications at low airflow. The adapter assembly with a heat sink (e.g., shown in FIG. 2B) provides adequate cooling for high power removable devices (e.g., including FPGA/ASIC running around 18 W).

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An adapter assembly, comprising:
a plurality of system connectors configured to simultaneously engage a plurality of receiving connectors of an external system when inserted in the external system and simultaneously disengage from the plurality of receiving connectors of the external system when disengaged from the external system, wherein the plurality of system connectors conform to a first form factor specification;
a device-receiving connector configured to engage a connector of a removable device, wherein the adapter assembly is configured to house at least a portion of the removable device and the device-receiving connector conforms to a second form factor specification different from the first form factor specification; and
connections between at least a portion of the plurality of system connectors and the device-receiving connector, wherein:
the connections are configured to route communication lanes of the removable device to one or more of the plurality of system connectors; and
the plurality of system connectors is configured to support the connections including by supporting at least one of additional bandwidth or communication lanes via a second one of the plurality of system connectors in response to a first one of the system connectors being unable to accommodate at least one of bandwidth and communication lanes of the device-receiving connector.

2. The adapter assembly of claim 1, wherein each of the plurality of system connectors conforms to an M.2 interface connector standard.

3. The adapter assembly of claim 1, wherein each of the plurality of system connectors includes 67 pins.

4. The adapter assembly of claim 1, wherein the device-receiving connector conforms to an EDSFF interface connector standard.

5. The adapter assembly of claim 1, wherein a number of pin positions of the device-receiving connector is one of the following: 56, 84, 140, or 168.

6. The adapter assembly of claim 1, wherein the removable device is a storage device.

7. The adapter assembly of claim 1, wherein the removable device is a computing device.

8. The adapter assembly of claim 1, further comprising a voltage regulator configured to provide a voltage conversion between a voltage received via the plurality of system connectors and a voltage provided to the device-receiving connector.

9. The adapter assembly of claim 1, further comprising a signal translator configured to level shift, repeat, or translate a signal communicated in at least one of the connections.

10. The adapter assembly of claim 9, wherein the signal translator is a level shifter.

11. The adapter assembly of claim 9, wherein the signal translator is a repeater.

12. The adapter assembly of claim 1, wherein the removable device is configured to communicate with the external system via a PCIe bus.

13. The adapter assembly of claim 1, further comprising a thermal element cover configured to dissipate heat from the removable device.

14. The adapter assembly of claim 13, wherein the thermal element cover is removable and configured to contact the removable device.

15. The adapter assembly of claim 1, further comprising a mechanical engagement element configured to engage with a corresponding mechanical engagement element coupled to a chassis of the external system.

16. The adapter assembly of claim 1, wherein the communication lanes are PCIe communication lanes.

17. The adapter assembly of claim 1, wherein the connections include at least two connections from the device-receiving connector to each of the plurality of system connectors.

18. The adapter assembly of claim 1, further comprising a second device-receiving connector configured to engage a connector of a second removable device, wherein the adapter assembly is configured to house at least a portion of the second removable device.

19. A system, comprising:
a processor; and
a plurality of receiving connectors configured to simultaneously engage a plurality of system connectors of an adapter assembly when the adapter assembly is inserted in the system and simultaneously disengage from the plurality of system connectors of the adapter assembly when the adapter assembly is disengaged from the system, wherein the plurality of system connectors conform to a first form factor specification; and
wherein the adapter assembly includes:
a device-receiving connector configured to engage a connector of a removable device, wherein the adapter assembly is configured to house at least a portion of the removable device and the device-receiving connector conforms to a second form factor specification different from the first form factor specification; and
connections between at least a portion of the plurality of system connectors and the device-receiving connector, wherein:
the connections are configured to route communication lanes of the removable device to one or more of the plurality of system connectors; and
the plurality of system connectors is configured to support the connections including by supporting at least one of additional bandwidth or communication lanes via a second one of the plurality of system connectors in response to a first one of the system connectors being unable to accommodate at least one of bandwidth and communication lanes of the device-receiving connector.

20. A device, comprising:
a plurality of system connectors configured to simultaneously engage a plurality of receiving connectors of an external system when inserted in the external system and simultaneously disengage from the plurality of receiving connectors of the external system when disengaged from the external system, wherein the plurality of system connectors conform to a first form factor specification;
a first device-receiving connector configured to engage a connector of a first removable device and the first device-receiving connector conforms to a second form factor specification different from the first form factor specification;
a second device-receiving connector configured to engage a connector of a second removable device;
a first group of connections between at least a portion of the plurality of system connectors and the first device-receiving connector, wherein the first group of connections is configured to route communication lanes of the first removable device to one or more of the plurality of system connectors; and
a second group of connections between at least a portion of the plurality of system connectors and the second device-receiving connector, wherein the second group of connections is configured to route communication lanes of the second removable device to one or more of the plurality of system connectors, wherein the plurality of system connectors is configured to support the first group of connections and the second group of connections including by supporting at least one of additional bandwidth or communication lanes via a second one of the plurality of system connectors in response to a first one of the system connectors being unable to accommodate at least one of bandwidth and communication lanes of the first device-receiving connector.

* * * * *